US010224293B2

(12) United States Patent
Yu et al.

(10) Patent No.: US 10,224,293 B2
(45) Date of Patent: Mar. 5, 2019

(54) PACKAGE STRUCTURE AND METHOD FOR FORMING THE SAME

(71) Applicant: Taiwan Semiconductor Manufacturing Company, Ltd., Hsinchu (TW)

(72) Inventors: Chen-Hua Yu, Hsinchu (TW); Jing-Cheng Lin, Hsinchu (TW); Tsei-Chung Fu, Toufen Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/495,788

(22) Filed: Apr. 24, 2017

(65) Prior Publication Data

US 2017/0229404 A1    Aug. 10, 2017

Related U.S. Application Data

(63) Continuation of application No. 14/971,132, filed on Dec. 16, 2015, now Pat. No. 9,633,924.

(51) Int. Cl.
*H01L 21/00*  (2006.01)
*H01L 23/00*  (2006.01)
(Continued)

(52) U.S. Cl.
CPC ...... *H01L 23/562* (2013.01); *H01L 21/02068* (2013.01); *H01L 21/02118* (2013.01);
(Continued)

(58) Field of Classification Search
CPC .............. H01L 21/561; H01L 23/3107; H01L 21/76898; H01L 21/56; H01L 21/4864; H01L 23/5389
See application file for complete search history.

(56) References Cited

U.S. PATENT DOCUMENTS 4,234,458 A    11/1980  Antos
4,946,518 A    8/1990   Spanjer et al.
(Continued)

FOREIGN PATENT DOCUMENTS

JP    11233545 A       8/1999
JP    2001203448 A     7/2001
(Continued)

OTHER PUBLICATIONS

Fauty, Joseph et al., "Mold Compund Adhesion to Bare Copper Lead Frames—Effect of Laser Texturing," The International Jounral of Microcircuits and Electronic Packaging, vol. 25, No. 1, 2002, 32 pages.

*Primary Examiner* — Ngan Ngo
(74) *Attorney, Agent, or Firm* — Slater Matsil, LLP (57) ABSTRACT

A package structure and method for forming the same are provided. The package structure includes a substrate and a semiconductor die formed over the substrate. The package structure also includes a package layer covering the semiconductor die and a conductive structure formed in the package layer. The package structure includes a first insulating layer formed on the conductive structure, and the first insulating layer includes monovalent metal oxide. A second insulating layer is formed between the first insulating layer and the package layer. The second insulating layer includes monovalent metal oxide, and a weight ratio of the monovalent metal oxide in the second insulating layer is greater than a weight ratio of the monovalent metal oxide in first insulating layer.

20 Claims, 10 Drawing Sheets

(51) Int. Cl.
| | | |
|---|---|---|
| *H01L 21/02* | (2006.01) | |
| *H01L 33/62* | (2010.01) | |
| *H01L 21/768* | (2006.01) | |
| *H01L 21/56* | (2006.01) | |
| *H01L 23/31* | (2006.01) | |
| *H01L 25/10* | (2006.01) | |
| *H01L 21/3205* | (2006.01) | |
| *H01L 23/528* | (2006.01) | |
| *H01L 23/532* | (2006.01) | |
| *H01L 21/48* | (2006.01) | |
| *H01L 23/538* | (2006.01) | |
| *H01L 25/00* | (2006.01) | |
| *H01L 23/525* | (2006.01) | |

(52) U.S. Cl.
CPC .. *H01L 21/02175* (2013.01); *H01L 21/02244* (2013.01); *H01L 21/02252* (2013.01); *H01L 21/02255* (2013.01); *H01L 21/32051* (2013.01); *H01L 21/486* (2013.01); *H01L 21/4853* (2013.01); *H01L 21/4857* (2013.01); *H01L 21/4864* (2013.01); *H01L 21/56* (2013.01); *H01L 21/561* (2013.01); *H01L 21/565* (2013.01); *H01L 21/568* (2013.01); *H01L 21/76832* (2013.01); *H01L 21/76834* (2013.01); *H01L 21/76888* (2013.01); *H01L 21/76898* (2013.01); *H01L 23/3107* (2013.01); *H01L 23/3114* (2013.01); *H01L 23/3121* (2013.01); *H01L 23/3128* (2013.01); *H01L 23/528* (2013.01); *H01L 23/5383* (2013.01); *H01L 23/5384* (2013.01); *H01L 23/5386* (2013.01); *H01L 23/5389* (2013.01); *H01L 23/53228* (2013.01); *H01L 23/53295* (2013.01); *H01L 24/08* (2013.01); *H01L 24/13* (2013.01); *H01L 24/19* (2013.01); *H01L 24/20* (2013.01); *H01L 24/32* (2013.01); *H01L 25/105* (2013.01); *H01L 25/50* (2013.01); *H01L 33/62* (2013.01); *H01L 23/525* (2013.01); *H01L 24/16* (2013.01); *H01L 24/73* (2013.01); *H01L 24/92* (2013.01); *H01L 2224/0231* (2013.01); *H01L 2224/0233* (2013.01); *H01L 2224/0401* (2013.01); *H01L 2224/04105* (2013.01); *H01L 2224/05005* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05184* (2013.01); *H01L 2224/12105* (2013.01); *H01L 2224/13024* (2013.01); *H01L 2224/13025* (2013.01); *H01L 2224/13111* (2013.01); *H01L 2224/16227* (2013.01); *H01L 2224/19* (2013.01); *H01L 2224/32225* (2013.01); *H01L 2224/48227* (2013.01); *H01L 2224/48247* (2013.01); *H01L 2224/73204* (2013.01); *H01L 2224/73265* (2013.01); *H01L 2224/73267* (2013.01); *H01L 2224/92125* (2013.01); *H01L 2224/92244* (2013.01); *H01L 2225/1035* (2013.01); *H01L 2225/1041* (2013.01); *H01L 2225/1058* (2013.01); *H01L 2924/01029* (2013.01); *H01L 2924/0541* (2013.01); *H01L 2924/15311* (2013.01); *H01L 2924/181* (2013.01)

(56) References Cited

U.S. PATENT DOCUMENTS

| | | | |
|---|---|---|---|
| 8,314,004 | B2 | 11/2012 | Matsumoto et al. |
| 8,828,100 | B1 | 9/2014 | Warner et al. |
| 9,508,664 | B1 | 11/2016 | Lin et al. |
| 9,859,222 | B1* | 1/2018 | Kim .................. H01L 23/5389 |
| 2002/0000657 | A1* | 1/2002 | Wen ....................... H01L 23/66 257/737 |
| 2005/0285230 | A1 | 12/2005 | Kim |
| 2006/0003579 | A1 | 1/2006 | Sir |
| 2007/0020946 | A1 | 1/2007 | Tanaka |
| 2007/0065651 | A1 | 3/2007 | Glatkowski et al. |
| 2008/0070054 | A1 | 3/2008 | Sumita et al. |
| 2008/0241682 | A1 | 10/2008 | Huang et al. |
| 2009/0105335 | A1 | 4/2009 | Luchini et al. |
| 2009/0151972 | A1* | 6/2009 | Potter .................. B81C 1/00269 174/50.5 |
| 2009/0311166 | A1 | 12/2009 | Hart et al. |
| 2010/0009240 | A1 | 1/2010 | Fly et al. |
| 2010/0071940 | A1* | 3/2010 | Ejiri ....................... H05K 3/244 174/257 |
| 2010/0255323 | A1 | 10/2010 | Nakamura et al. |
| 2011/0272796 | A1* | 11/2011 | Eaton .................. B81C 1/00269 257/682 |
| 2011/0287926 | A1 | 11/2011 | Lalman et al. |
| 2012/0153444 | A1* | 6/2012 | Haga .................. H01L 23/4334 257/666 |
| 2012/0168212 | A1 | 7/2012 | Ha et al. |
| 2013/0022871 | A1 | 1/2013 | Traulsen et al. |
| 2013/0308175 | A1 | 11/2013 | Yasui et al. |
| 2014/0009514 | A1 | 1/2014 | Abe et al. |
| 2014/0072700 | A1 | 3/2014 | Kim et al. |
| 2014/0131858 | A1 | 5/2014 | Pan et al. |
| 2014/0252600 | A1 | 9/2014 | Chang et al. |
| 2014/0252647 | A1 | 9/2014 | Huang et al. |
| 2014/0264853 | A1 | 9/2014 | Lin et al. |
| 2014/0332966 | A1* | 11/2014 | Xiu ...................... H01L 23/293 257/773 |
| 2014/0353648 | A1 | 12/2014 | Abe et al. |
| 2015/0037980 | A1* | 2/2015 | Rha ...................... H01L 21/306 438/700 |
| 2015/0200181 | A1* | 7/2015 | Haga .................... B23K 20/005 438/127 |
| 2017/0040531 | A1* | 2/2017 | Chung .................... H01L 43/12 |
| 2018/0012862 | A1* | 1/2018 | Yu ....................... H01L 23/3128 |
| 2018/0082921 | A1* | 3/2018 | Grassmann ......... H01L 21/4871 |
| 2018/0096919 | A1* | 4/2018 | Roth .................... H01L 21/561 |

FOREIGN PATENT DOCUMENTS

| | | |
|---|---|---|
| JP | 2002076618 A | 3/2002 |
| JP | 2004022699 A | 1/2004 |
| JP | 2006270031 A | 10/2006 |
| JP | 2007043084 A | 2/2007 |
| JP | 2010062175 A | 3/2010 |
| JP | 2010212492 A | 9/2010 |
| JP | 2011114233 A | 6/2011 |
| KR | 1020140061959 A | 5/2014 |

* cited by examiner

PACKAGE STRUCTURE AND METHOD FOR FORMING THE SAME

PRIORITY CLAIM AND CROSS REFERENCE TO RELATED APPLICATIONS

This application is a continuation of and claims priority to U.S. patent application Ser. No. 14/971,132, filed on Dec. 16, 2015, which application is incorporated herein by reference.

This application is related to the following co-pending a commonly assigned patent application: U.S. patent application Ser. No. 14/970,962, filed on Dec. 16, 2015, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structure have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1H' shows a cross-sectional representation of a wet process performed on the conductive structure, in accordance with some embodiments of the disclosure.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Figure 1A:
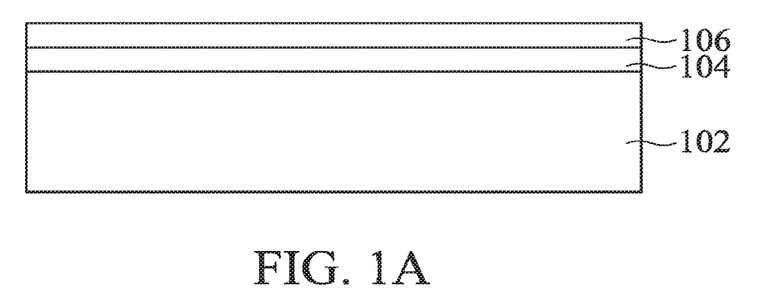
FIGS. 1A-1N show cross-sectional representations of various stages of forming a package structure, in accordance with some embodiments of the disclosure.

Embodiments for a package structure and method for forming the same are provided. FIGS. 1A-1N show cross-sectional representations of various stages of forming a package structure 100, in accordance with some embodiments of the disclosure. The package structure 100 is applied to wafer level package (WLP).

As shown in FIG. 1A, a substrate 102 is provided. The substrate 102 is a temporary support substrate. In some embodiments, the substrate 102 is made of semiconductor material, ceramic material, polymer material, metal material, another applicable material or combinations thereof. In some embodiments, the substrate 102 is a glass substrate. In some embodiments, the substrate 102 is a semiconductor substrate, such as silicon wafer.

An adhesive layer 104 is formed on the substrate 102. In some embodiments, the adhesive layer is made of glue or foil. In some other embodiments, the adhesive layer 104 is made of a photosensitive material which is easily detached from the substrate 102 by light irradiation. In some embodiments, the adhesive layer 104 is made of a heat-sensitive material.

Afterwards, a base layer 106 is formed on the adhesive layer 104. In some embodiments, the base layer 106 is made of polymer or a polymer-containing layer. The base layer 106 may be a poly-p-phenylenebenzobisthiazole (PBO) layer, a polyimide (PI) layer, a solder resist (SR) layer, an Ajinomoto buildup film (ABF), a die attach film (DAF), another applicable material or combinations thereof. In some embodiments, the adhesive layer 104 and the base layer 106 are deposited or laminated over the substrate 102.

Figure 1B:
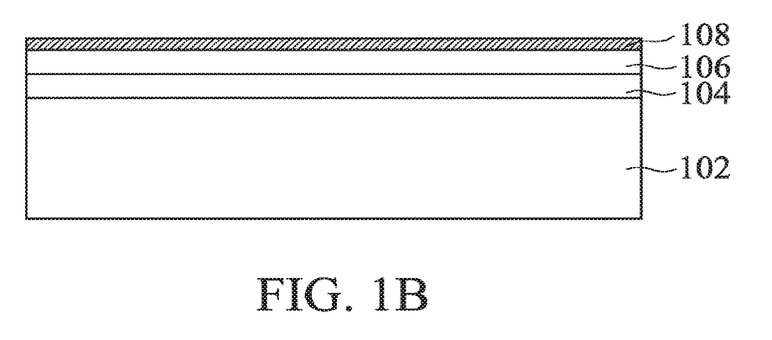

Afterwards, a seed layer 108 is formed over the base layer 106 as shown in FIG. 1B, in accordance with some embodiments of the disclosure. In some embodiments, the seed layer 108 is made of metal material, such as copper (Cu), titanium (Ti), copper alloy, titanium alloy or combinations thereof. In some embodiments, the seed layer 108 is formed by a deposition process, such as chemical vapor deposition process (CVD), physical vapor deposition process (PVD), another applicable process or combinations thereof.

Figure 1C:
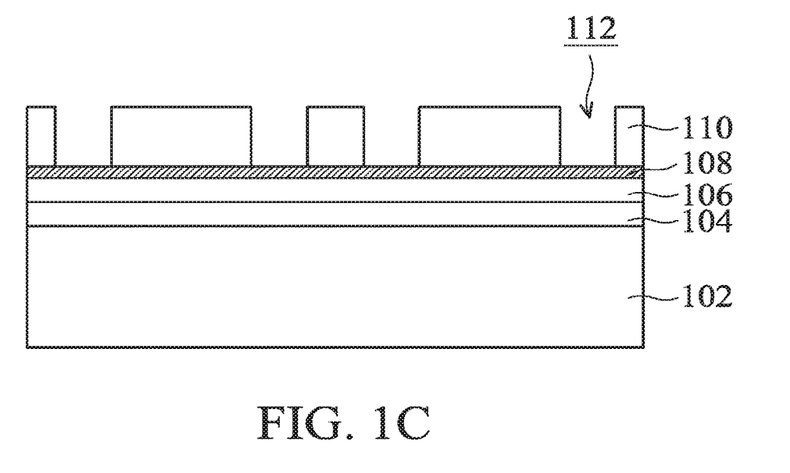

After the seed layer 108 is formed on the base layer 106, a mask layer 110 is formed on the seed layer 108, as shown in FIG. 1C, in accordance with some embodiments of the disclosure. The openings 112 are formed in the mask layer 110. The seed layer 108 is exposed by the openings 112. The openings 112 are used to define the position of the conductive structure (formed later, shown in FIG. 1D). In some embodiments, the mask layer 110 is made of a photoresist material. The openings 112 are formed by a patterning process. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Figure 1D:
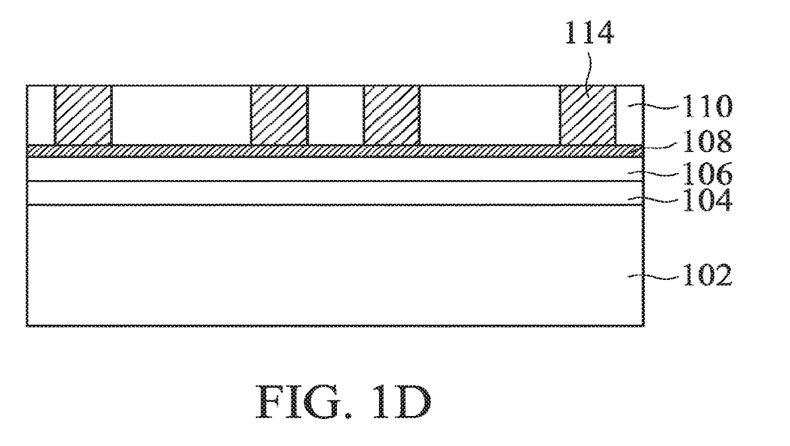

Afterwards, the conductive structure 114 is formed in the mask layer 110 as shown in FIG. 1D, in accordance with some embodiments of the disclosure. The conductive structure 114 is filled into the openings 112. The conductive structure 114 may be made of metal material, such as copper (Cu), aluminum (Al), tungsten (W), nickel (Ni), alloy thereof or combinations thereof. The top-view shape of the conductive structure 114 may be rectangle, square, circle, or the like. The height of the conductive structure 114 dependents on the thickness of the mask layer 110. In some embodiments, the conductive structure 114 is formed by a plating process.

Figure 1E:
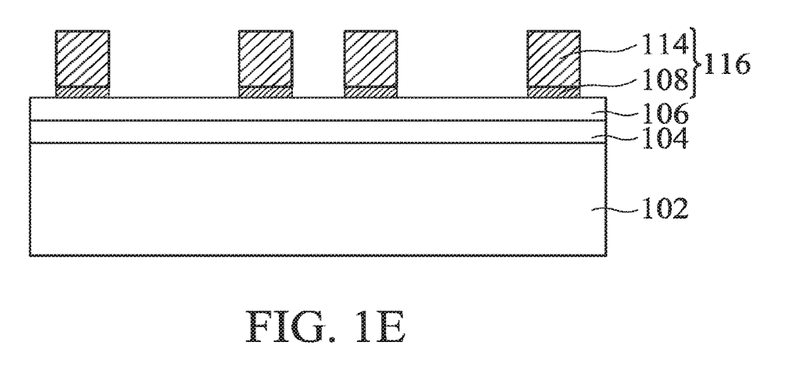

Afterwards, the mask layer 110 is removed, and an etching process is performed to remove a portion of seed layer 108 as shown in FIG. 1E, in accordance with some embodiments of the disclosure. During the etching process, the conductive structure 114 is used as a mask. As a result, the conductive structure 114 and the remaining seed layer 108 are in combination referred to as through InFO vias (TIV) 116, which are also referred to as through-vias 116. In some embodiments, the conductive structure 114 and the seed layer 108 are made of the same material, and therefore there is no distinguishable interface therebetween.

Figure 1F:
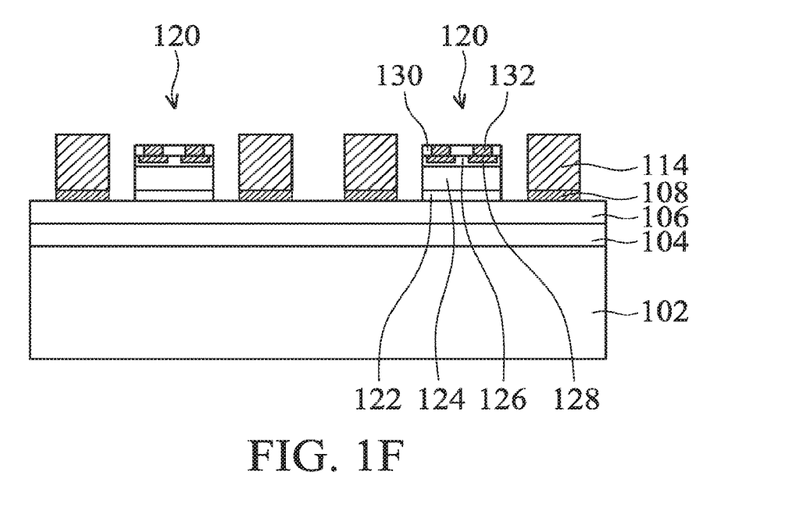

Afterwards, a semiconductor die 120 is formed over the base layer 106 through an adhesive layer 122 as shown in FIG. 1F, in accordance with some embodiments of the disclosure. The height of the conductive structure 114 is higher than the height of the semiconductor die 120. The top surface of the conductive structure 114 is higher than the top surface of the semiconductor die 120.

In some embodiments, the adhesive layer 122 is die attach film (DAF). The semiconductor die 120 includes a semiconductor substrate 124, a dielectric layer 126, a conductive pad 128, a passivation layer 130 and a connector 132. The conductive pad 128 is formed in the dielectric layer 126, and the connector 132 is formed in the passivation layer 130. The connector 132 is electrically connected to the conductive pad 128.

Other device elements may be formed in the semiconductor die 120. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

Figure 1G:
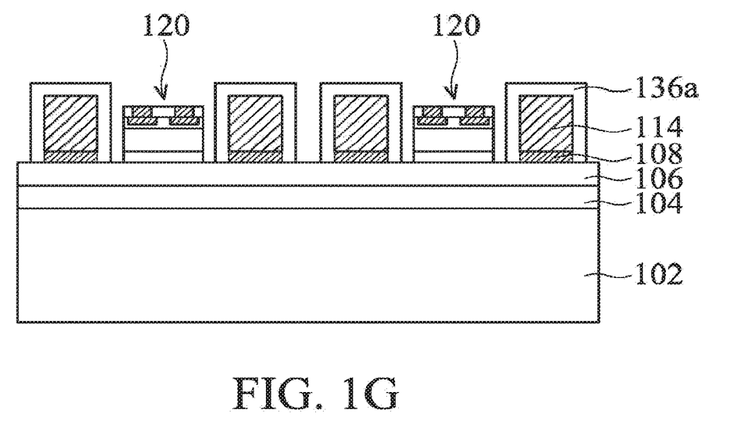

As shown in FIG. 1G, a first insulating layer 136a is spontaneously formed on the conductive structure 114. The first insulating layer 136a surrounds the conductive structure 114. In other words, the conductive structure 114 and the seed layer 108 are surrounded by the first insulating layer 136a.

The conductive structure 114 includes a metal material, and the first insulating layer 136a includes a metal element that is the same as that of the metal material. In some embodiments, the first insulating layer 136a is a native oxide layer. In some embodiments, the conductive structure 114 includes copper (Cu), and the first insulating layer 136a includes cupric oxide and cuprous oxide (CuO and $Cu_2O$).

It should be noted that the first insulating layer 136a is formed between the conductive structure 114 and a package layer (formed later, such as package layer 140 shown in FIG. 1I). However, delamination between the first insulating layer 136a and the package layer may occur during a subsequent process, such as a heating process. For example, during a heating operation, the heat may cause stress, and it may cause delamination of the package layer.

Figure 1H:
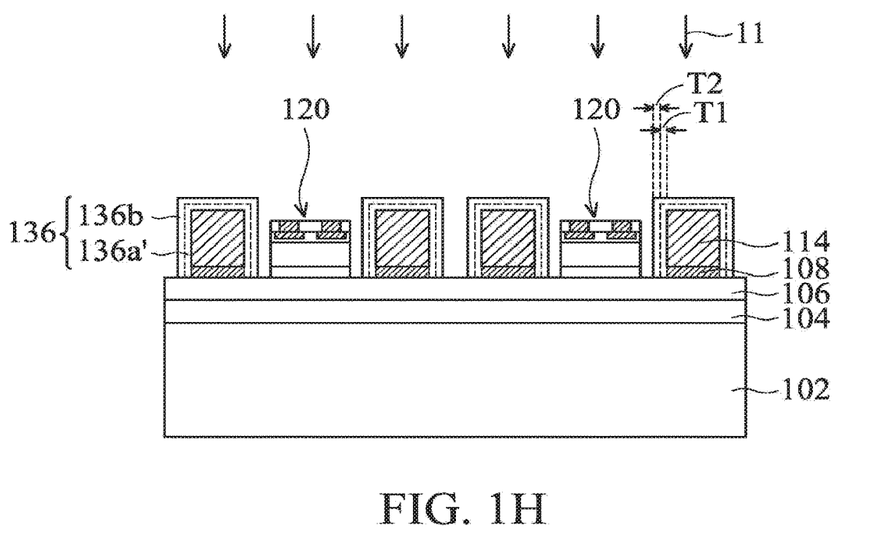

In some embodiments, a plasma process 11 is performed on the conductive structure 114 and transforms an outer part of the first insulating layer to a second insulating layer 136b, in accordance with some embodiments of the disclosure. For example, the second insulating layer 136b is formed over the conductive structure 114, as shown in FIG. 1H. Compared with the surface of the first insulating layer 136a before performing the plasma process 11, a roughened surface on the second insulating layer 136b is obtained after the plasma process 11 is performed. The first insulating layer 136a' has a first thickness $T_1$, and the second insulating layer 136b has a second thickness $T_2$. In some embodiments, a ratio ($T_1/T_2$) of the first thickness $T_1$ to the second thickness $T_2$ is in a range from about 1/1 to about 1/0.2.

After the plasma process 11, the insulating layer 136 includes the first insulating layer 136a' and the second insulating layer 136b. The first insulating layer 136a' is closer to the conductive structure 114 than the second insulating layer 136b. In other words, the first insulating layer 136a' is formed in direct contact with the conductive structure 114, and the second insulating layer 136b is formed in direct contact with the package layer 140 (shown in FIG. 1I). The dash line in the insulating layer 136, as shown in FIG. 1H, is used to schematically define the two layers. In other words, the insulating layer 136 includes monovalent metal oxide at a first location near an outside surface of the insulating layer 136 more than it at a second location near an inner surface which is in contact with the conductive structure 114. The description of "near an outer surface" is in the thickness range of the second insulating layer 136b, and "near an inner surface" is in the thickness in the first insulating layer 136a'.

In some embodiments, compositions of monovalent metal oxide and divalent metal oxide in two layers 136a', 136b are different. For example, the weight ratios of monovalent metal oxide and divalent metal oxide are different in the first insulating layer 136a' and the second insulating layer 136b. The adhesion may be improved to avoid delamination problems by forming the second layer 136b.

The conductive structure 114 includes a metal material, and the first insulating layer 136a' and the second insulating layer 136b include the same metal element as that of the metal material. More specifically, both the first insulating layer 136a' and the second insulating layer 136b include monovalent metal oxide and divalent metal oxide, and the second insulating layer 136b includes higher ratio of monovalent metal oxide. For example, the conductive structure 114 includes copper (Cu), and the first insulating layer 136a' and the second insulating layer 136b include cupric oxide (CuO) and cuprous oxide ($Cu_2O$).

It should be noted that a weight ratio of the monovalent metal oxide in the second insulating layer 136b is greater than a weight ratio of the monovalent metal oxide in the first insulating layer 136a'. In some embodiments, the conductive structure 114 includes copper (Cu), and a weight ratio of cuprous oxide ($Cu_2O$) in the second insulating layer 136b is greater than that of cuprous oxide ($Cu_2O$) in the first insulating layer 136a'. In some embodiments, the weight ratio of cuprous oxide ($Cu_2O$) in the second insulating layer 136b is in a range from about 30% to about 60%. In some embodiments, the weight ratio of cuprous oxide ($Cu_2O$) in the first insulating layer 136a' is in a range from about 20% to about 28%. In some embodiments, the weight ratio of cuprous oxide ($Cu_2O$) in the second insulating layer 136b is about 1.5 to 3 times of that of cuprous oxide ($Cu_2O$) in the first insulating layer 136a'.

In some other embodiments, the weight ratio of cuprous oxide ($Cu_2O$) and cupric oxide (CuO) in the second insulating layer 136b gradually increases from the inner surface to the outer surface of the second insulating layer 136b. The inner surface is the interface between the first insulating layer 136a' and the second insulating layer 136b. The outer surface is the interface between the second insulating layer 136b and the package layer 140. In some embodiments, the weight ratio of cuprous oxide ($Cu_2O$) and cupric oxide (CuO) is substantially constant in the first insulating layer 136a'.

Furthermore, the surface roughness of the second insulating layer 136b is greater than that of the first insulating layer 136a'. The high roughness increases the contact area, and therefore improves adhesion strength. The adhesion between the conductive structure 114 and the package layer 140 is improved by treating the surface of the conductive structure 114.

In other words, the monovalent metal oxide provides better bonding characteristics between the conductive structure 114 and the subsequently formed package layer 140, comparing with the divalent metal oxide.

In some embodiments, the plasma process 11 includes performing a pre-cleaning process and a main plasma process. The pre-cleaning process is configured to clean the surface of the conductive structure 114 and to remove some contaminations. If the contaminations are not removed, they may hinder and decrease the adhesion between the conductive structure 114 and the package layer 140. The main plasma process is configured to alter the components of the first insulating layer 136a. Therefore, the second insulating layer 136b formed over the first insulating layer 136a' is obtained.

In some embodiments, the cleaning process includes using nitrogen ($N_2$) gas with a flow rate in a range from about 200 sccm to about 600 sccm. In some embodiments, the cleaning process is performed at a pressure in a range from about 20 Pa to about 70 Pa. In some embodiments, the cleaning process is performed for a period of time in a range from about 10 seconds to about 70 seconds. When the pre-cleaning process is performed for a period of time within the above-mentioned range, the contaminations are removed completely.

In some embodiments, the main plasma process includes using oxygen ($O_2$) gas with a flow rate in a range from about 100 sccm to about 300 sccm. In addition oxygen ($O_2$) gas, the main plasma process also includes using argon (Ar) gas with a flow rate in a range from about 100 sccm to about 300 sccm. The argon (Ar) gas is also used to increase surface roughness. In some embodiments, the main plasma process is performed at a pressure in a range from about 20 Pa to about 40 Pa. In some embodiments, the main plasma process is performed for a period of time in a range from about 5 seconds to about 50 seconds. When the main plasma process is performed for a period of time within the above-mentioned range, the ratio of the monovalent metal oxide in the second insulating layer 136b is increased.

In some other embodiments, a wet process 13 is performed on the conductive structure 114 and transforms an outer part of the insulating layer 136a to a second insulating layer 136b. The second insulating layer 136b is formed over the conductive structure 114, as shown in FIG. 1H', in accordance with some embodiments of the disclosure.

In some embodiments, the wet process 13 includes placing the substrate 102 in a chemical bath 20. The chemical bath 20 includes an input 202 and an output 204. The input 202 is used to provide an input for the chemical solution, and the output 204 is used to provide an output for the chemical solution. A propeller 206 is used to stir and circulate the chemical solution, and therefore the substrate 102 may be uniformly reacted with the chemical solution.

After the wet process 13, the insulating layer 136 including the first insulating layer 136a' and the second insulating layer 136b is obtained. The first insulating layer 136a' includes monovalent metal oxide and the divalent metal oxide. The second insulating layer 136b includes monovalent metal oxide and the divalent metal oxide. In some embodiments, the monovalent metal oxide is cuprous oxide ($Cu_2O$), and the divalent metal oxide is cupric oxide (CuO) or copper hydroxide ($Cu(OH)_2$).

It should be noted that a weight ratio of the monovalent metal oxide in the second insulating layer 136b is greater than a weight ratio of the monovalent metal oxide in first insulating layer 136a'. In some embodiments, a ratio of the monovalent metal oxide in the second insulating layer 136b is in a range from about 30 wt % to about 60 wt %. In some embodiments, a ratio of the monovalent metal oxide in the first insulating layer 136a' is in a range from about 20 wt % to about 28 wt %.

In some embodiments, the chemical solution includes hydrogen peroxide ($H_2O_2$) solution. In some embodiments, the hydrogen peroxide ($H_2O_2$) solution has a concentration in a range from about 20 wt % to about 60 wt %. In some embodiments, the chemical bath 20 is performed at room temperature. In some embodiments, the chemical bath 20 is performed at a temperature in a range from about 20 degrees to about 40 degrees.

After the wet process 13, an optional cleaning process is performed on the insulating layer 136. The cleaning process is used to remove some contaminations which may come from the chemical bath 20. If contaminations are remaining over the insulating layer 136, the contaminations may block the adhering of the package layer 140. In some embodiments, the cleaning process includes using nitrogen ($N_2$) gas with a flow rate in a range from about 200 sccm to about 700 sccm.

It should be noted that the hydrogen peroxide ($H_2O_2$) solution is easy to prepare and the chemical bath 20 is performed at room temperature without heating the chemical bath 20. Therefore, the cost for performing the wet process 13 is relatively low. The wet process 13 may be used for mass production.

As mentioned above, the adhesion between the conductive structure 114 and the package layer 140 is improved by performing the plasma process 11 or performing the wet process 13. The delaminated problem is avoided. Therefore, the reliability and performance of the package structure 100 are further improved.

Figure 1I:
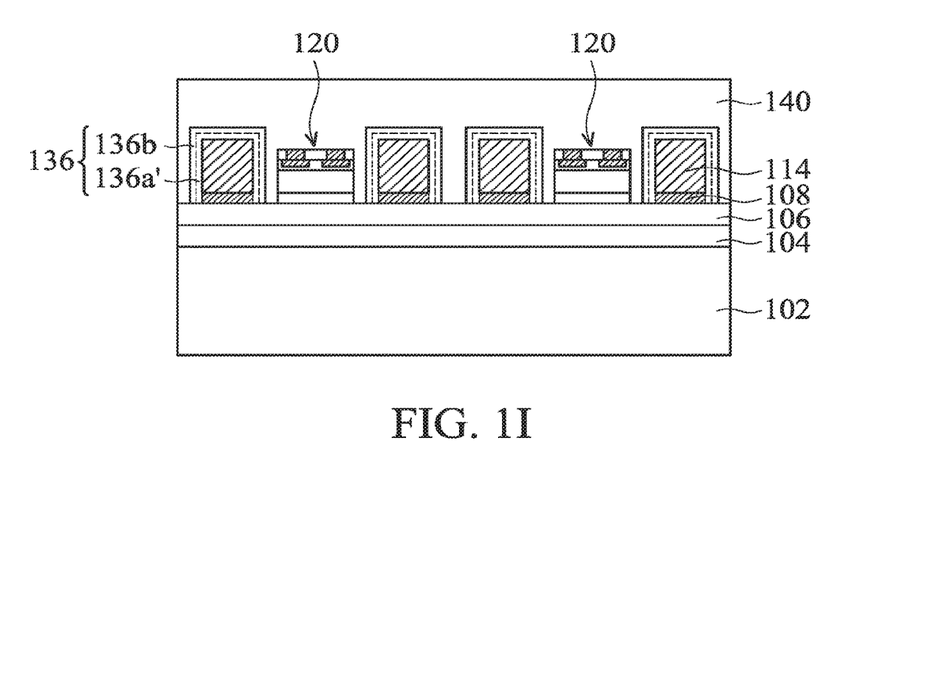

Afterwards, the package layer 140 is formed over the semiconductor die 120 and the insulating layer 136 as shown in FIG. 1I, in accordance with some embodiments of the disclosure. In some embodiments, the package layer 140 completely encapsulates and covers the semiconductor die 120. The top surface of the package layer 140 is higher than the top surface of the conductive structure 114 and the top surface of the semiconductor die 120.

In some embodiments, the package layer 140 is made of molding compound, such as liquid epoxy, deformable gel, silicon rubber, or the like. In some embodiments, the molding compound is dispensed over the base layer 106, the semiconductor die 120 and the insulating layer 136 and therefore a thermal process is performed to harden the molding compound.

Figure 1J:
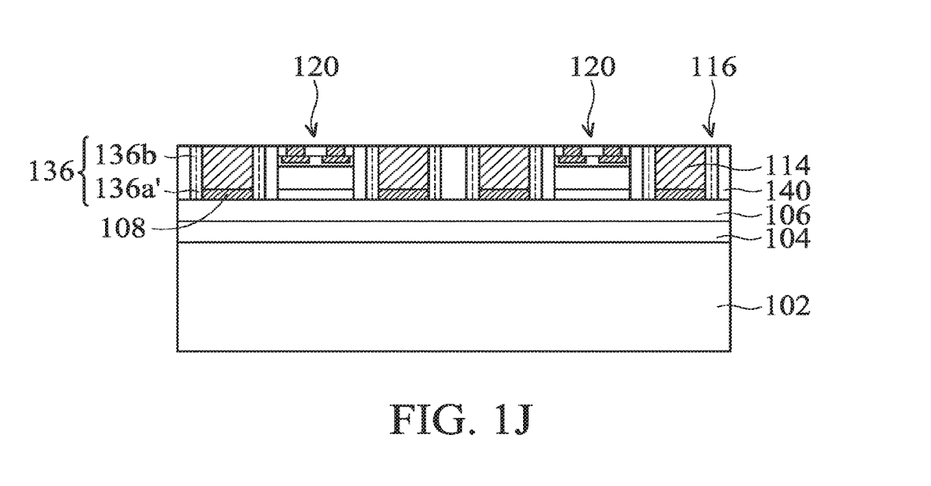

After the package layer 140 is formed, a planarizing process is performed to expose the semiconductor die 120 and the through InFO vias (TIV) 116, as shown in FIG. 1J, in accordance with some embodiments of the disclosure. After the planarizing process, the top surface of the semiconductor die 120 is substantially level with that of the conductive structure 114. In some embodiments, the planarizing process includes grinding process, a chemical mechanical polishing (CMP) process, an etching process, another applicable process or combinations thereof.

Figure 1K:
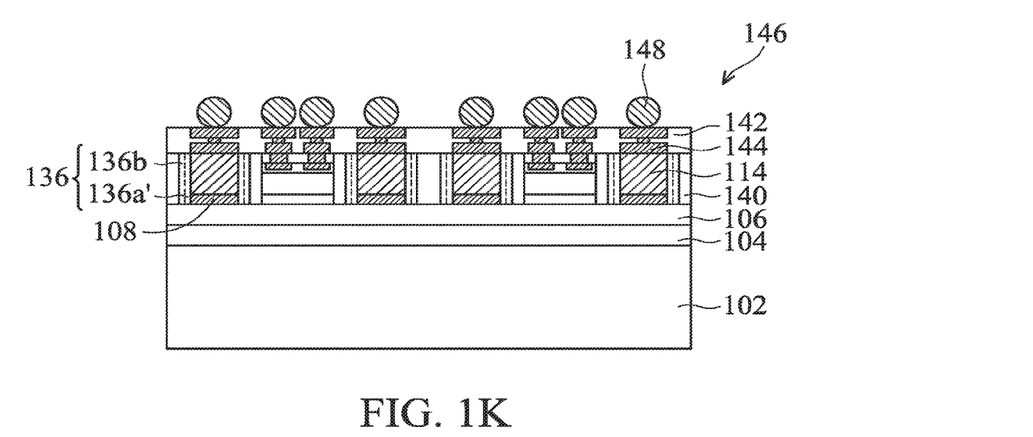

After the planarizing process, a redistribution structure 146 is formed over the package layer 140 as shown in FIG. 1K, in accordance with some embodiments of the disclosure. The redistribution structure 146 includes the redistribution lines (RDL) 144 formed in the passivation layer 142. The RDL 144 is electrically connected to the semiconductor die 120 and the through InFO vias (TIV) 116.

In some embodiments, the redistribution lines (RDL) 144 are made of metal materials, such as copper (Cu), copper alloy, aluminum (Al), aluminum alloy, tungsten (W), tungsten alloy, titanium (Ti), titanium alloy, tantalum (Ta), or tantalum alloy. In some embodiments, the RDL 144 is formed by plating, electroless plating, sputtering or chemical vapor deposition (CVD). In some embodiments, the passivation layer 142 is made of polybenzoxazole (PBO), benzocyclobutene (BCB), silicone, acrylates, siloxane, or combinations thereof. In some other embodiments, the passivation layer 142 is made of non-organic materials, such as silicon oxide, un-doped silicate glass, silicon oxynitride, solder resist (SR), silicon nitride, HMDS (hexamethyldisilazane).

Afterwards, electrical connector 148 is formed over the redistribution structure 146. In some embodiments, the electrical connector 148 includes the solder ball, metal pillar, another applicable connector. In some embodiments, an under bump metallurgy (UBM) layer (not shown) is formed below the electrical connector 148.

Figure 1L:
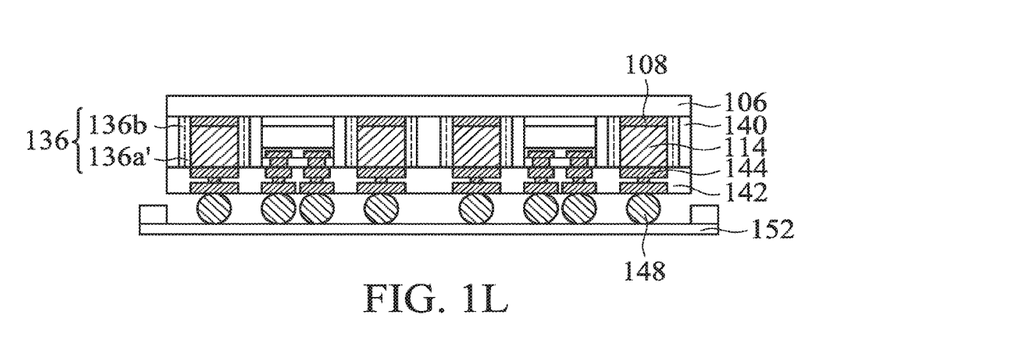

Afterwards, the substrate 102 and the adhesive layer 104 are removed, and the structure of FIG. 1K is flipped and attached to a carrier 152, as shown in FIG. 1L, in accordance with some embodiments of the disclosure. As a result, the base layer 106 faces up and is exposed. The carrier 152 includes a tape which is photosensitive or heat-sensitive and is easily detached from the electrical connector 148.

Figure 1M:
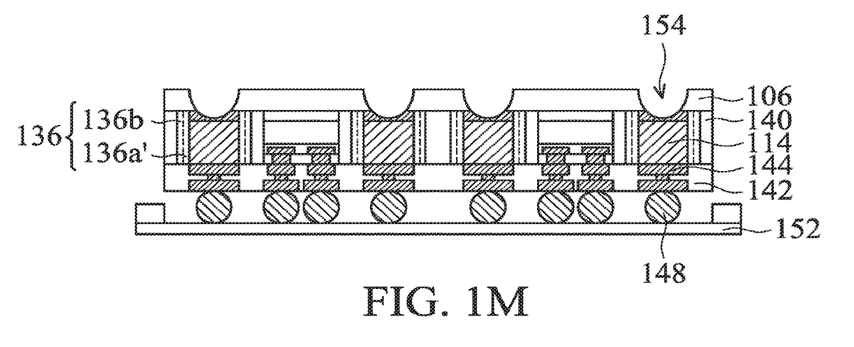
Figure 1N:
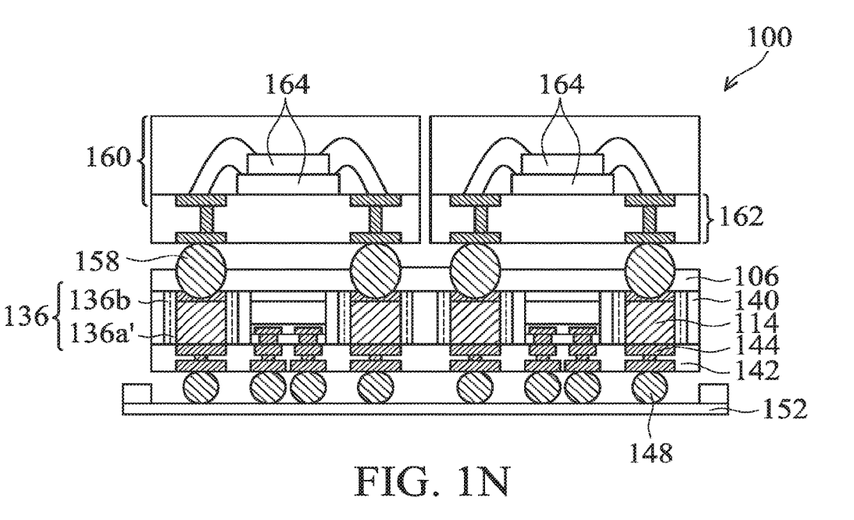

Afterwards, a portion of the base layer 106 is removed to form opening 154, as shown in FIG. 1M, in accordance with some embodiments of the disclosure. In some embodiments, a portion of the seed layer 108 is removed, and the seed layer 108 is exposed. In some other embodiments, the seed layer 108 is not removed or completely removed. In some other embodiments, the opening 154 is formed by a laser drilling process, an etching process, or another applicable process.

After the opening 154 is formed, an electrical connector 158 is filled into the opening 154, as shown in FIG. 1N, in accordance with some embodiments of the disclosure. Afterwards, the top package 160 is bonded to the electrical connector 158. The top package 160 includes a package substrate 162 and semiconductor dies 164. In some embodiments, the semiconductor dies 164 includes memory dies, such as Static Random Access Memory (SRAM) die, Dynamic Random Access Memory (DRAM) die or the like.

Afterwards, the semiconductor structure 100 may continue to undergo other processes to form other structures or devices. Afterwards, a dicing process is performed to separate the structure as shown in FIG. 1N. into chip packages.

Figure 2A:
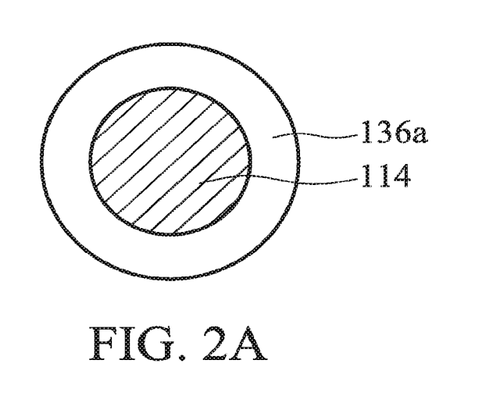
FIG. 2A shows a top-view representation of a conductive structure, before the plasma process or the wet process, in accordance with some embodiments of the disclosure.

FIG. 2A shows a top-view representation of a conductive structure 114, before the plasma process 11 or the wet process 13 in accordance with some embodiments of the disclosure. As shown in FIG. 2A, the first insulating layer 136a surrounds the conductive structure 114, and the top-view shape of the conductive structure 114 is a circle.

Figure 2B:
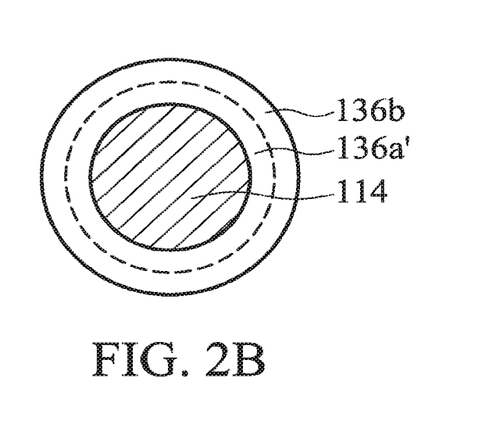
FIG. 2B shows a top-view representation of a conductive structure, after the plasma process or the wet process, in accordance with some embodiments of the disclosure.

FIG. 2B shows a top-view representation of a conductive structure 114 after the plasma process 11 or the wet process 13, in accordance with some embodiments of the disclosure. After performing the plasma process 11 or the wet process 13, the second insulating layer 136b formed over the first insulating layer 136a' is obtained. The second insulating layer 136b will be in direct contact with the package layer 140. The surface roughness of the second insulating layer 136b is increased to improve the adhesion between the conductive structure 114 and the package layer 140.

As mentioned above, the insulating layer 136 includes monovalent metal oxide at a first location near an outside surface of the insulating layer 136 more than it at a second location near an inner surface which is in contact with the conductive structure 114. The description of "near an outer surface" is in the thickness range of the second insulating layer 136b, and "near an inner surface" is in the thickness in the first insulating layer 136a'.

Figure 3A:
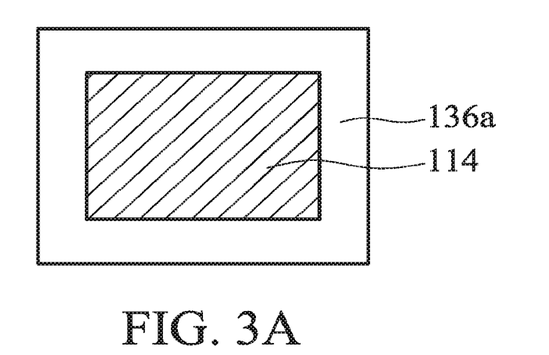
FIG. 3A shows a top-view representation of a conductive structure, before the plasma process or the wet process, in accordance with some embodiments of the disclosure.

FIG. 3A shows a top-view representation of a conductive structure 114, in accordance with some embodiments of the disclosure. As shown in FIG. 3A, a first insulating layer 136a surrounds the conductive structure 114, and the top-view shape of the conductive structure 114 is rectangle.

Figure 3B:
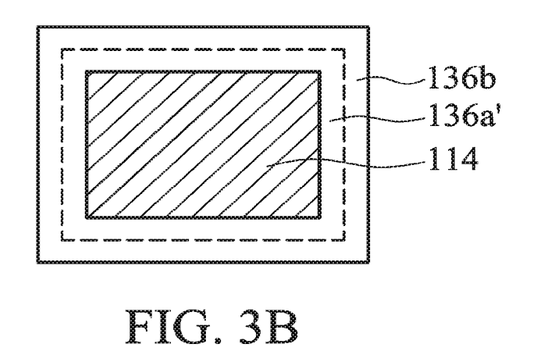
FIG. 3B shows a top-view representation of a conductive structure, after the plasma process or the wet process, in accordance with some embodiments of the disclosure.

FIG. 3B shows a top-view representation of a conductive structure 114 after the plasma process 11 or the wet process 13, in accordance with some embodiments of the disclosure. The weight ratio of the monovalent metal oxide in the second insulating layer 136b is greater than a weight ratio of the monovalent metal oxide in first insulating layer 136a'. The bonding strength is improved by altering the ratio of the second insulating layer 136b. As a result, the reliability and performance of the package structure 100 are further improved.

Embodiments for forming a package structure and method for forming the same are provided. A semiconductor die is formed over a substrate, and a package layer covers the semiconductor die. A conductive structure is formed in the package layer, and the insulating layer is formed between the conductive structure and the package layer. A plasma process or a wet process is performed on the conductive structure to form the insulating layer including a first insulating layer and a second insulating layer. The second insulating layer is in direct contact with the package layer and has a larger surface roughness to improve the adhesion.

When the adhesion is improved, the delamination problem is avoided. Therefore, the performance of the package structure is also improved.

In some embodiments, a package structure is provided. The package structure includes a substrate and a semiconductor die formed over the substrate. The package structure also includes a package layer covering the semiconductor die and a conductive structure formed in the package layer. The package structure includes a first insulating layer formed on the conductive structure, and the first insulating layer includes monovalent metal oxide. The package structure includes a second insulating layer formed between the first insulating layer and the package layer. The second insulating layer includes monovalent metal oxide, and a weight ratio of the monovalent metal oxide in the second insulating layer is greater than a weight ratio of the monovalent metal oxide in first insulating layer.

In some embodiments, a package structure is provided. The package structure includes a substrate and a semiconductor die formed over the substrate. The package structure also includes a package layer adjacent to the semiconductor die and a conductive structure formed in the package layer. The package structure further includes an insulating layer formed on the conductive structure. The insulating layer includes monovalent metal oxide at a first location near an outside surface of the insulating layer more than it at a second location near an inner surface which is in contact with the conductive structure.

In some embodiments, a method for forming a package structure is provided. The method includes forming a conductive structure over a substrate and forming a semiconductor die over a substrate. The semiconductor die is surrounded by the conductive structure. The method further includes performing a wet process or a plasma process on the conductive structure to form an insulating layer over the conductive structure. The insulating layer includes a second insulating layer over a first insulating layer, and the first insulating layer and the second insulating layer both include monovalent metal oxide. A weight ratio of the monovalent metal oxide in the second insulating layer is greater than a weight ratio of the monovalent metal oxide in first insulating layer. The method also includes forming a package layer over the semiconductor die and the second insulating layer.

One general aspect of embodiments disclosed herein includes a method for forming a package structure, the method including: forming a conductive structure over a substrate; forming a semiconductor die over the substrate, where the semiconductor die is surrounded by the conductive structure; performing a wet process or a plasma process on the conductive structure to form an insulating layer over the conductive structure, where the insulating layer includes a second insulating layer over a first insulating layer, where the first insulating layer and the second insulating layer both include monovalent metal oxide, and a weight ratio of the monovalent metal oxide in the second insulating layer is greater than a weight ratio of the monovalent metal oxide in first insulating layer; and forming a package layer over the semiconductor die and the second insulating layer.

Another general aspect of embodiments disclosed herein includes a method including: forming a conductive structure on a substrate (102); forming an oxide layer on the conductive structure, the oxide layer including both a monovalent metal oxide and a divalent metal oxide, and having a first weight ratio of monovalent metal oxide to divalent metal oxide; and converting a portion of the oxide layer to a second oxide having a weight ratio of monovalent metal oxide to divalent metal oxide that is greater than the first weight ratio Yet another general aspect of embodiments disclosed herein includes a method of forming a packaged structure, including: depositing a conductive structure on a substrate; allowing a native oxide to form on the conductive structure; converting a portion of the native oxide to a second oxide layer; and encapsulating the conductive structure in a package material, where the native oxide and second oxide layer are interposed between the conductive structure and the package material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, the method comprising:
   forming a conductive structure over a substrate;
   forming a semiconductor die over the substrate, wherein the semiconductor die is surrounded by the conductive structure;
   performing a wet process or a plasma process on the conductive structure to form an insulating layer over the conductive structure, wherein the insulating layer comprises a second insulating layer over a first insulating layer, wherein the first insulating layer and the second insulating layer both comprise monovalent metal oxide, and a weight ratio of the monovalent metal oxide in the second insulating layer is greater than a weight ratio of the monovalent metal oxide in first insulating layer; and
   forming a package layer over the semiconductor die and the second insulating layer.

2. The method for forming the package structure as claimed in claim 1, wherein performing the wet process on the conductive structure comprises:
   placing the substrate in a chemical bath, wherein the chemical bath comprises a hydrogen peroxide ($H_2O_2$) solution.

3. The method for forming the package structure as claimed in claim 2, wherein the hydrogen peroxide ($H_2O_2$) solution has a concentration in a range from about 20 wt % to about 60 wt %.

4. The method for forming the package structure as claimed in claim 1, after performing the wet process on the conductive structure, further comprising:
   performing a cleaning process on the conductive structure, wherein the cleaning process comprises using a nitrogen gas ($N_2$).

5. The method for forming the package structure as claimed in claim 1, further comprising:
   forming a redistribution layer formed over the package layer, wherein the redistribution layer is electrically connected to the semiconductor die.

6. The method for forming the package structure as claimed in claim 1, wherein performing the plasma process comprises:
 performing a cleaning process on the conductive structure; and
 performing a main plasma process on the conductive structure.

7. The method for forming the package structure as claimed in claim 6, wherein the cleaning process comprises using a nitrogen gas ($N_2$), and the main plasma process comprises using an oxygen gas ($O_2$).

8. A method comprising:
 forming a conductive structure on a substrate;
 forming an oxide layer on the conductive structure, the oxide layer including both a monovalent metal oxide and a divalent metal oxide, and having a first weight ratio of monovalent metal oxide to divalent metal oxide; and
 converting a portion of the oxide layer to a second oxide having a weight ratio of monovalent metal oxide to divalent metal oxide that is greater than the first weight ratio.

9. The method of claim 8, wherein converting a portion of the oxide layer to a second oxide layer comprises exposing the oxide layer to a plasma process or a wet process.

10. The method of claim 9, wherein the plasma process includes an oxygen plasma having an oxygen gas flow rate of from about 100 sccm to about 300 sccm.

11. The method of claim 9, wherein the wet process includes a hydrogen peroxide bath.

12. The method of claim 8, further comprising encapsulating the conductive structure in a package layer and removing a portion of the package layer, the second oxide and the oxide layer to expose a top surface of the conductive structure.

13. The method of claim 8, wherein the conductive structure has a circular shape when viewed from a top down view.

14. The method of claim 8, further comprising mounting an integrated circuit die on the substrate and electrically connecting the integrated circuit die to a second integrated circuit die through the conductive structure.

15. The method of claim 8, wherein the second oxide has a higher weight ratio of monovalent metal oxide to divalent metal oxide, relative to the oxide layer.

16. The method of claim 12, wherein the weight ratio of monovalent metal oxide to divalent metal oxide is greater at an interface between the second oxide layer and the package layer relative to at an interface between the second oxide layer and the oxide layer.

17. A method of forming a packaged structure, comprising:
 depositing a conductive structure on a substrate;
 allowing a native oxide to form on the conductive structure;
 converting a portion of the native oxide to a second oxide layer; and
 encapsulating the conductive structure in a package material, wherein the native oxide and second oxide layer are interposed between the conductive structure and the package material.

18. The method of claim 17, wherein converting a portion of the native oxide to a second oxide layer comprises exposing the native oxide to oxidizing plasma.

19. The method of claim 17, wherein converting a portion of the native oxide to a second oxide layer comprises submerging the native oxide in an oxidizing bath.

20. The method of claim 17, wherein converting a portion of the native oxide to a second oxide layer results in the second oxide layer having a higher weight ratio of monovalent metal oxide to divalent metal oxide, relative to the native oxide.

* * * * *